United States Patent
Li

(10) Patent No.: US 7,235,460 B2
(45) Date of Patent: Jun. 26, 2007

(54) METHOD OF FORMING ACTIVE AND ISOLATION AREAS WITH SPLIT ACTIVE PATTERNING

(75) Inventor: Jia Li, Dallas, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 264 days.

(21) Appl. No.: 09/803,715

(22) Filed: Mar. 9, 2001

(65) Prior Publication Data

US 2002/0048898 A1 Apr. 25, 2002

Related U.S. Application Data

(63) Continuation of application No. 08/099,952, filed on Jul. 30, 1993, now abandoned.

(51) Int. Cl.
*H01L 21/322* (2006.01)

(52) U.S. Cl. ............... 438/447; 438/218; 438/219; 438/225; 438/298; 438/448; 438/449; 438/451; 257/E29.02; 257/E21.545; 257/E21.551; 257/E21.558

(58) Field of Classification Search ........ 438/439, 438/444, 448, 225, 227, 298, 451, 218, 219, 438/407, 423, 440, 449, 452, 453, 447, 228; 257/647, E21.556, E29.02, E21.545, E21.551, 257/E21.558

See application file for complete search history.

(56) References Cited

U.S. PATENT DOCUMENTS 4,110,899 A * 9/1978 Nagasawa et al. .......... 438/227

4,829,019 A 5/1989 Mitchell et al. .............. 437/69
5,169,792 A * 12/1992 Katoh et al. ................ 257/398

FOREIGN PATENT DOCUMENTS

| EP | 0123384 A1 * | 2/1984 |
|---|---|---|
| EP | 0123384 | 10/1984 |
| EP | 0189208 | 7/1986 |
| EP | 0208935 | 1/1987 |
| EP | 0275508 | 7/1988 |
| EP | 0401174 | 12/1990 |
| JP | 0050634 | 4/1980 |

(Continued)

OTHER PUBLICATIONS

Silicon Processing for the VLSI Era, vol. 2, 1990 by Lattice Press, pp. 38-41.*

(Continued)

*Primary Examiner*—George R. Fourson
*Assistant Examiner*—Julio J. Maldonado
(74) *Attorney, Agent, or Firm*—Lisa K. Jorgenson; William A. Munck

(57) ABSTRACT

A process for forming isolation and active regions, wherein the patterning of an oxidation-barrier active stack is performed separately in the PMOS and NMOS regions. After the active stack is in place, two masking steps are used: one exposes the isolation areas on the NMOS side, for stack etch, channel-stop implant, and silicon recess etch (optional); the other masking step is exactly complementary, and performs the analogous operations on the PMOS side. After these two steps are performed (in either order), an additional nitride layer can optionally be deposited and etched to cover the sidewall of the active stack. Field oxide is then formed, and processing then proceeds in conventional fashion.

24 Claims, 1 Drawing Sheet

FOREIGN PATENT DOCUMENTS

| | | | |
|---|---|---|---|
| JP | 59-65445 | | 4/1984 |
| JP | 0271956 | | 11/1988 |
| JP | 63-271956 | * | 9/1998 |
| WO | WO 83/02197 | | 6/1987 |

OTHER PUBLICATIONS

"Silicon Processing for the VLSI Era," vol. 2,: Process Integration by Stanley Wolf, Ph.D., 1990, pp. 38-41.

International Electron Devices Meeting, Dec. 1982, Washington, D.C., "Electrical Properties of MOS Devices Made with Silo Technology," J. Hui, T.Y. Chiu, S. Wong and W.G. Oldham, IEEE, pp. 220-223.

International Electron Devices Meeting, Dec. 8, 1980, Washington, D.C., "Selective Polysilicon Oxidation Technology for Defect Free Isolation," Junichi Matsanaga, Naohiro Matsukawa, Hirosi Nozawa, and Susumu Kohyama, IEEE, pp. 565-568.

"Under Field Oxidation Dopant Enhancement (UFDE) for CMOS and BiCMOS Technology," Extended Abstracts of the 22nd (1990) International Conference on Solid State Devices and Mateo 1990, pp. 649-652.

* cited by examiner

METHOD OF FORMING ACTIVE AND ISOLATION AREAS WITH SPLIT ACTIVE PATTERNING

The present application is a continuation of U.S. application Ser. No. 08/099,952, now abandoned.

BACKGROUND OF THE INVENTION

The present invention relates to integrated circuit isolation structures.

BACKGROUND: ISOLATION TECHNIQUES

Adjacent elements on an integrated circuit must be electrically isolated from each other if they are to function independently. Therefore, it has long been recognized that the most basic elements of integrated circuit technology include not only active devices and interconnect, but also isolation.

The standard industry process for isolation of CMOS circuits has long been LOCOS ("LOCal Oxidation of Silicon"). In this process, a stack of silicon nitride and silicon oxide layers (or a stack of silicon nitride, polysilicon, and oxide layers) is patterned to provide an oxidation barrier in locations where active devices are to be formed (i.e., the active regions). This stack is referred to as an "active stack." Silicon is exposed in locations where a field oxide is desired for isolation. A "channel-stop" implant is then performed, using dopants which will prevent parasitic transistors from turning on. In CMOS processes (including BiCMOS, CBCMOS, etc.), two channel-stop implants are often necessary, one for P-type regions and one for N-type regions. Thus, two mask steps (in addition to the active mask) are normally required. In some processes it may be possible to save a mask by using a blanket implant for one of these. Such modifications are referred to as "counterdoping," since in some locations one implants will have to counteract the other. (See, e.g., U.S. Pat. No. 4,613,885 to Haken, which is hereby incorporated by reference.)

The wafer is then placed in an oxidizing environment to grow a thick field oxide (typically at least several thousand Ansgtroms) on the exposed silicon areas. The thickness of the field oxide must be sufficient that conductors atop the field oxide cannot invert the silicon under the oxide (with "channel-stop" or other doping therein), to turn on parasitic transistors. Silicon under the nitride will generally not be oxidized EXCEPT at the edge of the active stack, where lateral diffusion of oxygen under the active stack will cause a tapered shape, known as "bird's beak," in the resulting structure.

BACKGROUND: ALTERNATIVES TO LOCOS

A problem with LOCOS is that the bird's beak costs a substantial amount of area. For many years there have therefore been substantial attempts to find an alternative to LOCOS. Many of the proposed alternative technologies use localized oxidation with modifications to reduce the width of the bird's beak. One class of approach uses sacrificial polysilicon. See, e.g., Matsunaga et al., "Selective Polysilicon Oxidation Technology for Defect Free Isolation," 1980 IEDM 565ff, which is hereby incorporated by reference.

Other approaches use additional nitride to provide some lateral barrier to encroachment during the oxide growth step. See Kurosawa et al, "A New Bird's-Beak Free Field Isolation Technology for VLSI Devices," 1981 IEDM 384ff, which is hereby incorporated by reference ("BOX" isolation or "Buried Oxide isolation"); Chiu et al., "The SWAMI—A Defect Free and Near-Zero Bird's-Beak Local Oxidation Process and Its Application in VLSI Technology," 1982 IEDM 224ff, which is hereby incorporated by reference ("SWAMI" or "SideWAll Masked Isolation"); Hui et al., "Electrical Properties of MOS Devices Made With SILO Technology," 1982 IEDM 220ff, which is hereby incorporated by reference ("SILO" or "Sealed Interface Local Oxidation").

Difficulties of Conventional Mask Allocation

All conventional isolation process using localized oxidation have the following drawbacks as applied to modern technology:

1. If both n and p channel stop implants must be performed, then 3 masks will be needed: one for active, one for NMOS channel stop, and one for PMOS channel stop. Counterdoping may be able to eliminate one of those masks, but counterdoping imposes its own constraints.

2. The critical dimension (CD), or minimum geometry, cannot be optimized for the active areas in both N-well and P-well regions, due to the depth different caused by typical well formation processes.

3. Unless the active stack is capable of blocking the channel stop implants, the photoresist on top of the active stack must be hardened after active etch to survive the channel stop implant patterning to block the dopant. Critical dimension and slope of the photoresist must be sacrificed in order for the photoresist to survive the second patterning. Channel stop patterning is also affected by the first layer of photoresist.

SUMMARY OF THE INVENTION

The present invention provides a new technique for forming active and isolation areas, wherein the active areas in p regions and n regions are etched separately, using two separate patterning steps. Each of these two patterning steps not only patterns the oxidation barrier, but also patterns the respective channel stop implant (and optionally also a silicon recess etch).

Advantages of the new process include (but are not limited to) the following:

1. Two masks are needed instead of the three which would otherwise be required (unless counterdoping were used) if both n-type and p-type channel stop implants must be performed.

2. The critical dimensions of the active areas can be optimized separately in n and p regions.

3. Even if the active stack is incapable of blocking channel stop implant, it is not necessary to pattern photoresist on top of photoresist. In fact, with the disclosed innovative process, the active stack's power of blocking implant dopants is no longer a factor in choosing the active stack. Thus, higher energies can be used for the channel-stop implant if desired, without the difficulties of photoresist-on-photoresist processing.

4. The depth of recess etching into silicon in n and p regions can be independently adjusted to achieve the best planarization.

It should also be noted that the two needed masks can be expressed as logical combinations of an "active" pattern with an N+ pattern and a P+ pattern, respectively. Thus the masks needed for using the present invention, while different from the conventional masks, can readily be generated for all existing layouts.

BRIEF DESCRIPTION OF THE DRAWING

The present invention will be described with reference to the accompanying drawings, which show important sample embodiments of the invention and which are incorporated in the specification hereof by reference, wherein.

DETAILED DESCRIPTION

The numerous innovative teachings of the present application will be described with particular reference to the embodiments below. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

An example of the disclosed innovative process is as follows. (These steps are performed on a conventional silicon substrate, after the N-wells and/or P-wells have been conventionally formed to define n-type regions 102 and p-type regions 104.)

1. Deposit/grow active stack 110 (e.g., 800 Å of nitride over 130 Å of pad oxide).
2. Deposit and pattern photoresist 120A to expose the active stack 110 over the isolation areas 130A in the n-type regions 102. (The active areas in the n-type region, and the whole p-type region, remain covered with photoresist.)
3. Etch the exposed portions of the active stack 110 to expose silicon in the isolation areas in the n-type region.
4. [optional] Recess etch silicon 102 if so desired, e.g. to a depth of 2000 Å.
5. Perform PMOS channel stop implant 150A (e.g. $3 \times 10^{12}$ cm$^{-2}$ of phosphorous at 60 KeV).

Figure 1:
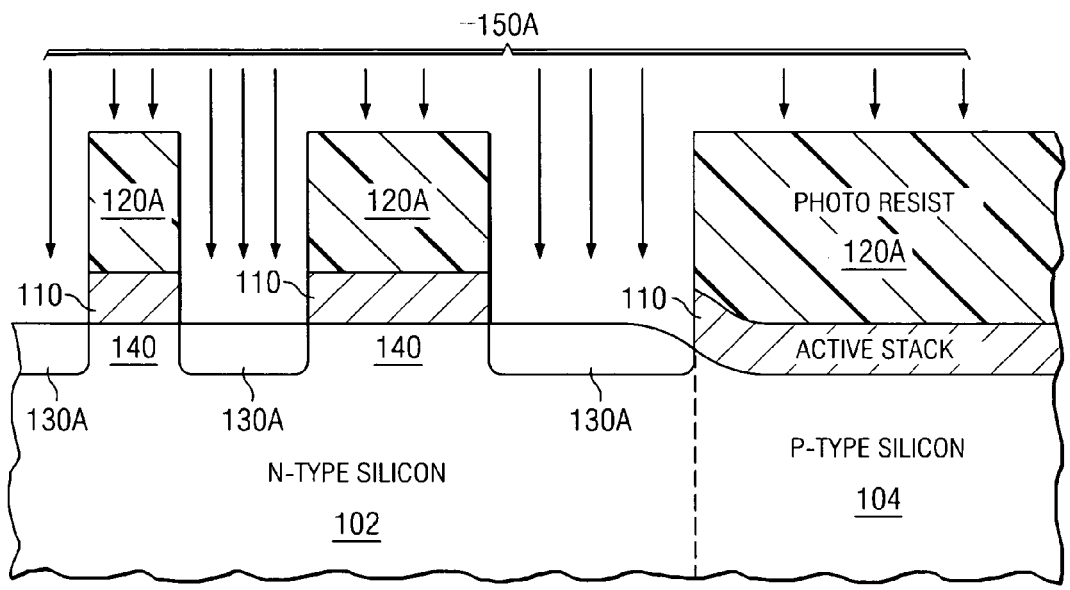
FIG. 1 shows a cross-sectional view of a silicon wafer during the p channel stop implant in a sample embodiment of the invention. (The dotted lines show the surface of silicon in an alternative embodiment, where the silicon has been recess etched.)

(FIG. 1 shows a cross sectional view of the wafer at this stage of the process.)

6. Remove photoresist 120A and clean wafer.
7. Deposit and pattern photoresist 120B to expose the active stack over the isolation areas 130B in the p-type region. (The active areas 140 in the p-type region 104, and the whole n-type region 102, remain covered with photoresist 120B.)
8. Etch the exposed portions of the active stack 110 to expose silicon 104 in the isolation areas 130B of the p-type region 104
9. [optional] Recess etch silicon 104 if so desired, e.g. to a depth of 2000 Å.
10. Perform NMOS channel stop implant 150B (e.g. $2.5 \times 10^{13}$ cm$^{-2}$ of boron at 100 KeV).

Figure 2:
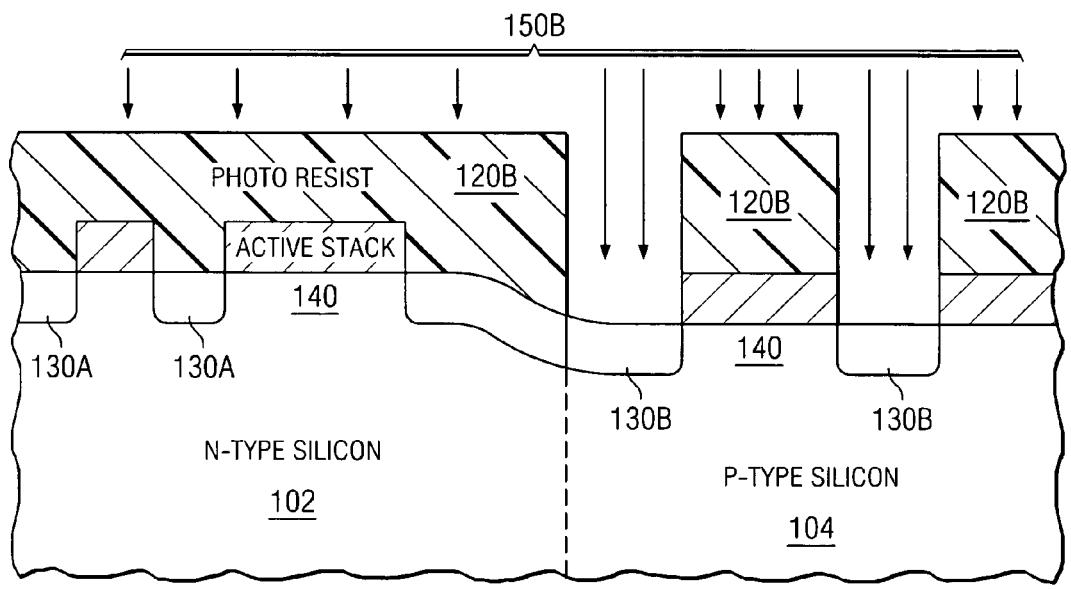
FIG. 2 shows a cross-sectional view of a silicon wafer during the n-channel stop implant in a sample embodiment of the invention. (The dotted lines show the surface of silicon in an alternative embodiment, where the silicon has been recess etched.)

(FIG. 2 shows a cross-sectional view of the wafer at this stage of the process.)

11. Remove all photoresist and clean wafer.
12. [optional] If desired, after recess etch, deposit nitride overall and perform anisotropic etchback to form nitride sidewall on active stack 110, to reduce lateral encroachment during field oxide growth.
13. Grow field oxide (e.g. to 5000 Å) and remove the active stack.

This finishes the active/isolation formation process. Processing can then continue with conventional further steps to form active devices, contacts, and interconnects.

Note that steps 7 through 11 can be performed before steps 2 through 6, if desired.

The steps of etching the active stack 110 and silicon 102/104 are preferably performed with conventional anisotropic plasma etching or reactive ion etching (RIE). As will be readily recognized by those skilled in the art, the particular process recipes and etch chemistries used for etching the active stack would be adjusted for the particular stack composition used. (For example, if the active stack includes an intermediate layer of polysilicon, then at least part of the active stack etch of step 3 should not be highly selective to silicon. For another example, if optional steps 4 and 9 are used, then a single etch step can be used to perform steps 3 and 4 together, using appropriate modulation of etchant species or using a nonselective anisotropic etch. For another example, of course the etches used do not have to be 100% anisotropic, i.e. do not strictly have to achieve 100% vertical sidewalls.) In any case, the particular chemistries used are not particularly relevant to the present invention.

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

For example, the presently preferred embodiment has been described in the context of a LOCOS process. However, the innovative ideas can also be combined with various approaches using sidewall nitride on the active stack, as discussed above. The innovative ideas can also be adapted, if desired, for combination with the various modified-LOCOS processes which have been proposed, some of which are described above.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. An integrated circuit structure fabrication method, comprising:

forming n-type and p-type regions within a substrate;

forming an oxidation barrier layer on a surface of the substrate over the n-type and p-type regions;

forming a first patterned layer exposing the oxidation barrier layer over first isolation areas in the n-type region and covering substantially all of the oxidation barrier layer over the p-type region and over active device areas in the n-type region;

removing portions of the oxidation barrier layer exposed by the first patterned layer to expose the first isolation areas;

implanting a first, p-type channel-stop dopant into the first isolation areas exposed by the first patterned layer and the remaining oxidation barrier layer;

removing the first patterned layer;

forming a second patterned layer on the remaining oxidation barrier layer over the n-type and p-type regions and on the exposed surface of the substrate in the first isolation areas, the second patterned layer exposing the remaining oxidation barrier layer over second isolation areas in the p-type region and covering substantially all of the remaining oxidation barrier layer over the n-type region and active device areas in the p-type region;

removing portions of the remaining oxidation barrier layer exposed by the second patterned layer to expose the second isolation areas;

implanting a second, n-type channel-stop dopant into the second isolation areas exposed by the second patterned layer and the remaining oxidation barrier layer;

removing the second patterned layer; and growing a field oxide on the surface of the substrate in the first and second isolation areas where exposed by the remaining oxidation barrier layer in a single oxidation step.

2. The method of claim 1, wherein the first isolation areas are protected by only the second patterned layer during implantation of the second channel-stop dopant into the second isolation areas.

3. The method of claim 1, wherein the oxidation barrier overlies an oxide layer which is patterned together with the oxidation barrier using the first and second patterned layers to expose the first and second isolation areas.

4. The method of claim 3, wherein the oxidation barrier overlies a polysilicon layer on the oxide layer which is patterned together with the oxidation barrier and the oxide layer using the first and second patterned layers to expose the first and second isolation areas.

5. The method of claim 1, wherein critical dimensions for the active device areas in the p-type region are selected independently from critical dimensions selected for the active device areas in the p-type region.

6. The method of claim 1, further comprising:
prior to removing the first patterned layer, etching the substrate through the first patterned layer to form recesses in the first isolation areas in the n-type region.

7. The method of claim 1, further comprising:
prior to removing the second patterned layer, etching the substrate through the second patterned layer to form recesses in the second isolation areas in the p-type region.

8. A method of forming an integrated circuit structure, comprising:
forming an active stack over two adjacent wells having opposite conductivity types within a substrate;
forming a first patterned layer exposing the active stack over isolation regions within a first of the two wells having a first conductivity type and covering the active stack over both active device areas within the first well and substantially all of a second of the two wells having a second conductivity type;
patterning the active stack using the first patterned layer to expose a surface of the substrate in isolation regions within the first well;
implanting a channel-stop of the second conductivity type into the exposed isolation regions within the first well masked by the first patterned layer and the remaining active stack, wherein the first patterned layer protects active device areas in the first well and substantially all of the second well during the implant of the channel-stop in the exposed isolation regions within the first well;

removing the first patterned layer;

forming a second patterned layer exposing the remaining active stack over isolation regions within the second well and covering the remaining active stack over both active device areas within the second well and substantially all of the first well;

patterning the active stack using the second patterned layer to expose the surface of the substrate in the isolation regions within the second well;

implanting a channel-stop of the first conductivity type into the exposed isolation regions within the second well masked by the second patterned layer, wherein the second patterned layer protects active device areas in the second well and substantially all of the first well during the implant of the channel-stop in the exposed isolation regions within the second well;

removing the second patterned layer; and growing a field oxide on the isolation regions within both the first and second wells with a single oxidation step.

9. The method of claim 8, wherein the isolation regions within the first well are protected by only the second patterned layer during implantation of the channel-stop into the isolation regions within the second well.

10. The method of claim 8, wherein the active stack further comprises:
a nitride layer overlying an oxide layer, wherein the nitride and oxide layers are patterned together using the first and second patterned layers to expose the first and second isolation areas.

11. The method of claim 10, wherein the active stack further comprises:
a polysilicon layer between the nitride and oxide layers, wherein the polysilicon layer is patterned together with the nitride and oxide layers using the first and second patterned layers to expose the first and second isolation areas.

12. The method of claim 8, wherein critical dimensions for the active device areas in the first well are selected independently from critical dimensions selected for the active device areas in the second well.

13. The method of claim 8, further comprising:
prior to removing the first patterned layer, etching the substrate through the first patterned layer to form recesses in the exposed isolation regions within the first well.

14. The method of claim 8, further comprising:
prior to removing the second patterned layer, etching the substrate through the second patterned layer to form recesses in the exposed isolation regions within the second well.

15. The method of claim 8, wherein the first well is an n-well and the second well is a p-well.

16. A method of forming an integrated circuit structure, comprising:
forming an active stack over two adjacent wells having opposite conductivity types within a substrate;
forming a first patterned layer exposing the active stack over isolation regions within a first of the two wells having a first conductivity type and covering the active stack over both active device areas within the first well and substantially all of a second of the two wells having a second conductivity type;

patterning the active stack using the first patterned layer to expose a surface of the substrate in isolation regions within the first well;

implanting a channel-stop of the second conductivity type into the exposed isolation regions within the first well masked by the first patterned layer and the remaining active stack, wherein the first patterned layer protects active device areas in the first well and substantially all of the second well during the implant of the channel-stop in the exposed isolation regions within the first well;

removing the first patterned layer;

forming a second patterned layer exposing the remaining active stack over isolation regions within the second well and covering the remaining active stack over both active device areas within the second well and substantially all of the first well;

patterning the active stack using the second patterned layer to expose the surface of the substrate in the isolation regions within the second well;

implanting a channel-stop of the first conductivity type into the exposed isolation regions within the second well masked by the second patterned layer, wherein the second patterned layer protects active device areas in the second well and substantially all of the first well during the implant of the channel-stop in the exposed isolation regions within the second well;

removing the second patterned layer; and forming isolation oxides concurrently on the isolation regions within both the first and second wells.

17. The method of claim 16, wherein the isolation oxides are formed by thermally growing oxide in the isolation regions.

18. The method of claim 16, wherein the isolation regions within the first well are protected by only the second patterned layer during implantation of the channel-stop into the isolation regions within the second well.

19. The method of claim 16, wherein the active stack further comprises:

a nitride layer overlying an oxide layer, wherein the nitride and oxide layers are patterned together using the first and second patterned layers to expose the first and second isolation areas.

20. The method of claim 18, wherein the active stack further comprises:

a polysilicon layer between the nitride and oxide layers, wherein the polysilicon layer is patterned together with the nitride and oxide layers using the first and second patterned layers to expose the first and second isolation areas.

21. The method of claim 16, wherein critical dimensions for the active device areas in the first well are selected independently from critical dimensions selected for the active device areas in the second well.

22. The method of claim 16, further comprising:

prior to removing the first patterned layer, etching the substrate through the first patterned layer to form recesses in the exposed isolation regions within the first well.

23. The method of claim 16, further comprising:

prior to removing the second patterned layer, etching the substrate through the second patterned layer to form recesses in the exposed isolation regions within the second well.

24. The method of claim 16, wherein the first well is an n-well and the second well is a p-well.

* * * * *